United States Patent
Wang

(10) Patent No.: US 9,431,405 B2
(45) Date of Patent: Aug. 30, 2016

(54) METHOD FOR FORMING FLASH MEMORY DEVICES

(71) Applicant: Semiconductor Manufacturing International (Shanghai) Corporation, Shanghai (CN)

(72) Inventor: Xinpeng Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/588,460

(22) Filed: Jan. 1, 2015

(65) Prior Publication Data

US 2015/0318294 A1 Nov. 5, 2015

(30) Foreign Application Priority Data

May 4, 2014 (CN) .......................... 2014 1 0184368

(51) Int. Cl.
| | |
|---|---|
| *H01L 21/336* | (2006.01) |
| *H01L 27/115* | (2006.01) |
| *H01L 21/28* | (2006.01) |
| *H01L 29/423* | (2006.01) |
| *H01L 21/762* | (2006.01) |

(52) U.S. Cl.
CPC ... *H01L 27/11521* (2013.01); *H01L 21/28273* (2013.01); *H01L 21/762* (2013.01); *H01L 21/76205* (2013.01); *H01L 27/11548* (2013.01); *H01L 29/42324* (2013.01)

(58) Field of Classification Search
CPC .................. H01L 27/11548; H01L 21/28273; H01L 27/11521; H01L 29/42324; H01L 21/76205
USPC ................ 438/242, 270, 259, 647; 257/315, 257/330–332
See application file for complete search history.

(56) References Cited

U.S. PATENT DOCUMENTS

| | | | |
|---|---|---|---|
| 2003/0104675 A1* | 6/2003 | Lim ................. | H01L 21/76224 438/424 |
| 2011/0018057 A1* | 1/2011 | Kim ................ | H01L 21/823437 257/330 |
| 2015/0179750 A1* | 6/2015 | Calafut ............ | H01L 29/42368 438/270 |

* cited by examiner

*Primary Examiner* — Dung Le
(74) *Attorney, Agent, or Firm* — Anova Law Group, PLLC

(57) ABSTRACT

A method is provided for fabricating a flash memory device. The method includes providing a semiconductor substrate; and forming a first polysilicon layer. The method also includes forming a hard mask layer; and forming a plurality of first openings exposing the first polysilicon layer in the hard mask layer and the first polysilicon layer. Further, the method includes forming a plurality of grooves by etching the semiconductor substrate along the first openings; and forming liner oxide layers by oxidizing the first polysilicon layer. Further, the method also includes forming shallow trench isolation structures by filling the first openings; and forming second openings by removing the hard mask layer and the non-oxidized first polysilicon layer. Further, the method also includes forming a tunnel oxide layer on a bottom of the second opening; and forming a floating gate on each of the tunnel oxide layers.

15 Claims, 5 Drawing Sheets

METHOD FOR FORMING FLASH MEMORY DEVICES

CROSS-REFERENCES TO RELATED APPLICATIONS

This application claims the priority of Chinese patent application No. 201410184368.8, filed on May 4, 2014, the entirety of which is incorporated herein by reference.

FIELD OF THE INVENTION

The present invention generally relates to the field of semiconductor memory and, more particularly, relates to flash memory devices and fabrication processes thereof.

BACKGROUND

Non-volatile memory (NVM) is a type of memory that does not loose stored information even when the power is not applied. Flash memory is a typical type of non-volatile memory. That is, the flash memory is able to keep the stored information even the electric power is wined off. While the stored information in volatile memory, such as dynamic random access memory (DRAM), or static random access memory, etc., is lost when the electric power is turned off. Comparing with other types of memories, the flashing memory has distinct advantages. For example, comparing with the erasable programmable read only memory (EPROM), the flash memory is electrically erasable and repeatedly programmable; and it does not require a special high power source although some of the first generation flash memories do. Further, comparing with the electrically erasable programmable read only memory (EEPROM), the flash memory has advantages including low cost, and high density, etc.

FIG. 1 illustrates an existing fabrication process of a flash memory device. As shown in FIG. 1, the process includes providing a semiconductor substrate; and forming a hard mask layer having a plurality of first openings exposing the surface of the semiconductor substrate the surface of the semiconductor substrate (S101). The method also includes forming a plurality of trenches in the semiconductor substrate by etching the semiconductor substrate along the first openings (S102). Further, the method includes forming shallow trench isolation structures by filling an isolation material in the trenches (S103). Further, the method also includes forming second openings exposing the surface of the semiconductor substrate between adjacent first openings by removing the hard mask layer (S104). Further, the method also includes forming a tunnel oxide layer on the surface of the semiconductor substrate at the bottom of the second openings (S105); and forming floating gates on the tunnel oxide layer (S106).

FIG. 2 illustrates a flash memory device formed by the process illustrated in FIG. 1. As shown in FIG. 2, the flash memory device includes a semiconductor substrate 100, and a floating gate silicon oxide layer 102 formed on the surface of the semiconductor substrate 100. The flash memory device also includes a floating gate 105 formed on the floating gate silicon oxide layer 102 and shallow trench isolation structures 101 with a portion formed in the surface of the semiconductor substrate 100 and the rest portion formed between adjacent floating gates 105. The surface of the floating gates 105 levels with the surface of the shallow trench isolation structures 101.

However, the performance of the flash memory device formed by the process illustrated in FIG. 1 needs further improvements. The disclosed device structures and methods are directed to solve one or more problems set forth above and other problems

BRIEF SUMMARY OF THE DISCLOSURE

One aspect of the present disclosure includes a method for fabricating a flash memory device. The method includes providing a semiconductor substrate; and forming a first polysilicon layer on as surface of the semiconductor substrate. The method also includes forming a hard mask layer on the first polysilicon layer; and thrilling a plurality of first openings exposing the first polysilicon layer in the hard mask layer and the first polysilicon layer by etching the hard mask layer and the first polysilicon layer. Further, the method includes forming a plurality of grooves in the semiconductor substrate by etching the semiconductor substrate along the first openings; and forming liner oxide layers by oxidizing the first polysilicon layer exposed by the first openings. Further, the method also includes forming shallow trench isolation structures covering the layer oxide layers by filling the first openings and the grooves with an isolation material; and forming second openings by removing the hard mask layer and the non-oxidized first polysilicon layer. Further, the method includes forming tunnel oxide layers on the surface of the semiconductor substrate at a bottom of each of the second openings; and forming a floating gate on each of the tunnel oxide layers.

Another aspect of the present disclosure includes a flash memory device. The flash memory device includes a semiconductor substrate; and a plurality of tunnel oxide layers formed on a surface of the semiconductor substrate. The flash memory device also includes a floating gate having a first portion with a width smaller than a width of the tunnel oxide layer and a second portion with a width greater than the width of the first portion formed on the first portion formed on each of the floating silicon oxide layers. Further, the flash memory device includes a plurality of shallow trench isolation structures formed in the surface of the semiconductor substrate between adjacent floating gates and the tunnel oxide layers; and liner oxide layers formed on side surfaces of the first portion of the floating gates.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
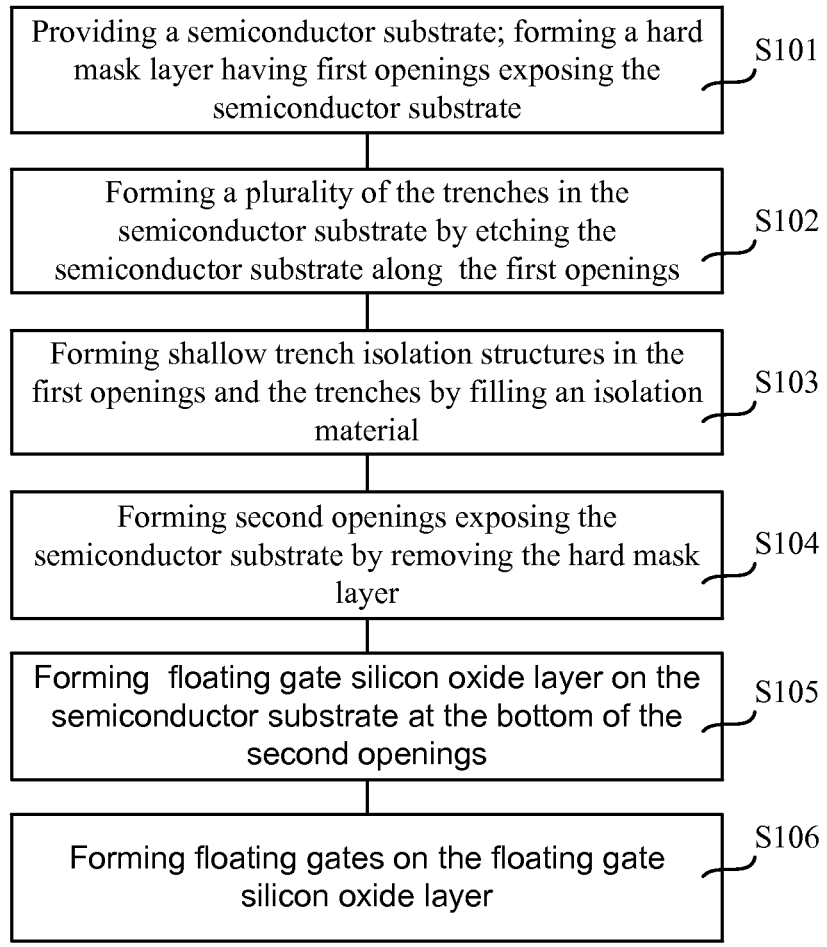
FIG. 1 illustrates an existing fabrication process of a flash memory devices.

The performance of the flash memory formed by the process illustrated in FIG. 1 may need further improvements. For example, the floating gate silicon oxide layer 102 of the flash memory device may have a time dependent dielectric, break down (TDDB) issue and a current leakage issue, etc.

Figure 2:
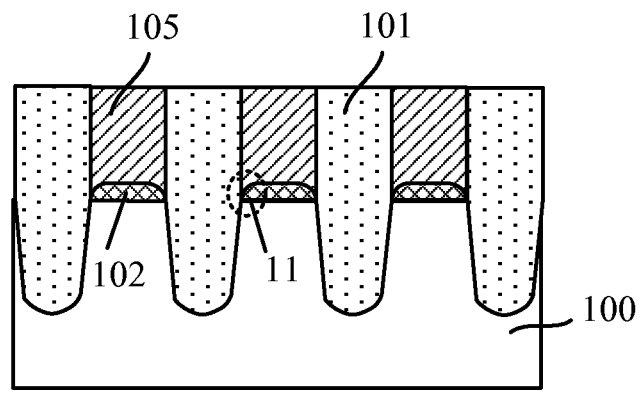
FIG. 2 illustrates a flash memory device formed by the existing fabrication process.

The TDDB issue and the current leakage issue of the floating gate silicon oxide layer 102 may relate with the non-uniformity of the thickness of the floating gate silicon oxide layer 102. The floating gate silicon oxide layer 102 may be formed by a thermal oxidation process. Referring to FIG. 2, the thickness of the floating silicon oxide layer 102 at the edge region of the floating gate silicon oxide layer 102, i.e., the contact region 11 at the interface of the floating gate silicon oxide layer 102 and the shallow trench isolation structures 101, may be smaller than the thickness of the floating gate silicon oxide layer 102 in the middle region. Further, the floating gates 105 may also have voids. Such a non-uniform thickness and voids formed in floating gates 105 may cause the TDDB issue and the leakage current issue, etc.

For example, referring to FIG. 2, the floating gate silicon oxide layer 102 at the edge region is relatively thin, and the floating gate 105 is subsequently formed on the floating gate silicon oxide layer 102. When the flash memory device is working, the electrons stored in the floating gate 103 may leak into the semiconductor substrate 100 through the relatively thin region of the floating gate silicon oxide layer 102.

The non-uniformity of the floating gate silicon oxide layer 102 may be caused by the fabrication processes of the flash memory device. As described above, the second opening may formed by removing the hard mask layer after forming the shallow trench isolation structures 101; and then the floating gate silicon oxide layer 102 may be formed in the second opening by a thermal oxidation process. When the floating gate silicon oxide layer 102 is being formed by the thermal oxidation process, because of a loading effect, the growth rate of the floating gate silicon oxide layer 102 on the surface of the semiconductor substrate 100 in the edge region may be smaller than the growth rate of the floating gate silicon oxide layer 102 on the surface of the semiconductor substrate 100 in the middle region. Thus, the thickness of the floating gate silicon oxide layer 012 in the edge region (the edge region of the bottom of the second opening) may be smaller than the thickness of the floating silicon oxide layer 102 in the middle region (the middle region of the bottom of the second opening). According to the disclosed device structures and methods, the non-uniformity issue of the floating gate silicon oxide layer and other problems may be solved by forming a liner oxide layer before forming shallow trench isolation structures.

Figure 10:
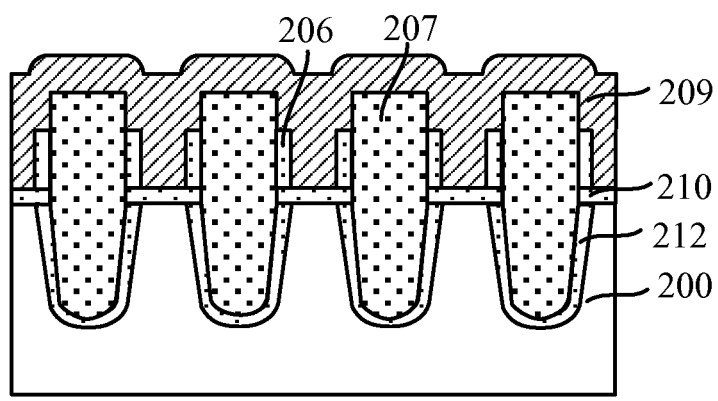
Figure 11:
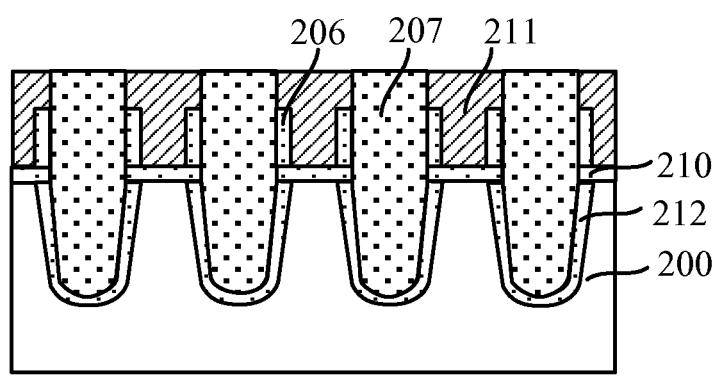
Figure 12:
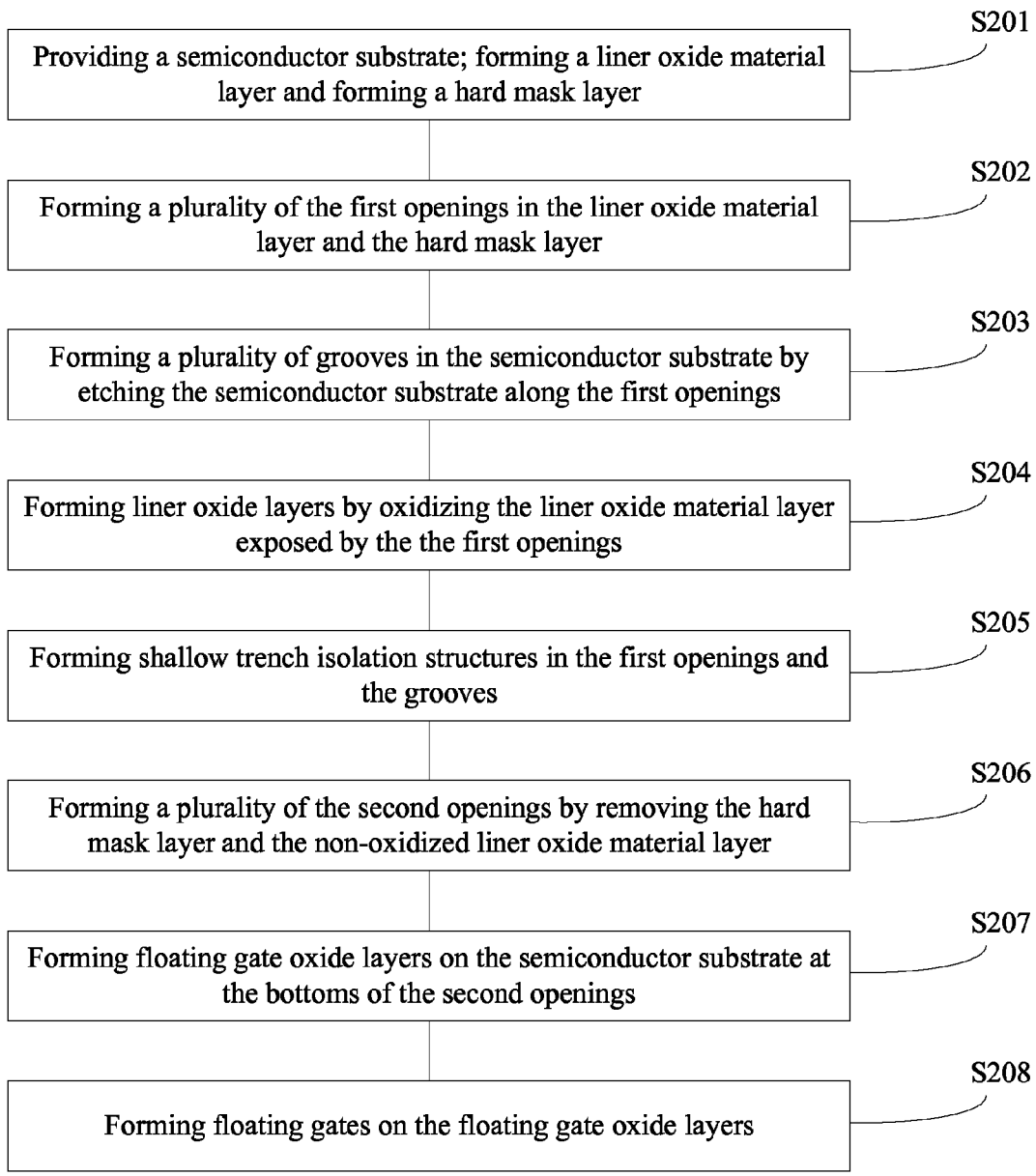
FIG. 12 illustrates an exemplary fabrication process of a flash memory device consistent with the disclosed embodiments.

FIG. 12 illustrates an exemplary fabrication process of a flash memory device consistent with the disclosed embodiments; and FIGS. 3~11 illustrate exemplary semiconductor structures corresponding, to various stages of the fabrication process.

Figure 3:
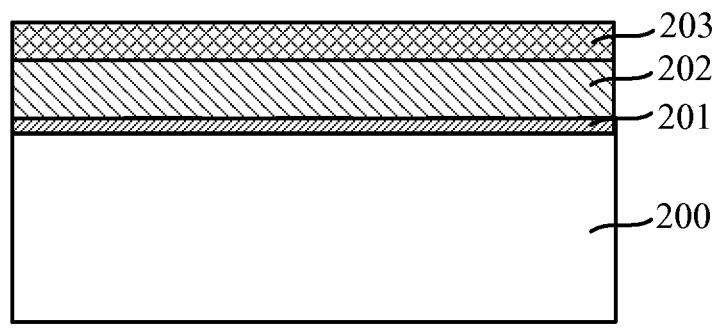
FIGS. 3~11 illustrate semiconductor structures corresponding to certain stages of an existing fabrication process of a flash memory device consistent with the disclosed embodiments.

As shown in FIG. 12, at the beginning of the fabrication process, a substrate with certain structures is provided (S201). FIG. 3 illustrates a corresponding semiconductor structure.

As shown in FIG. 3, a semiconductor substrate 200 is provided; and a first polysilicon layer 202 is formed on the surface of the semiconductor substrate 200. Further, a hard mask layer 203 is formed on the surface of the first polysilicon layer 202. The first polysilicon layer 202 may be used to subsequently form a liner oxide layer.

The substrate 200 may include any appropriate semiconductor materials, such as silicon, silicon on insulator (SOI), germanium on insulator (GOI) silicon germanium, carborundum, indium antimonide, lead telluride, indium arsenide, indium phosphide, gallium arsenide, gallium nitride, gallium antimonite, alloy semiconductor or a combination thereof. In one embodiment, the semiconductor substrate 200 is silicon. The substrate 200 provides a base for subsequent processes and structures.

The thickness of the first poly silicon layer 202 may be in a range of 100 Å~1000 Å. In one embodiment, the thickness of the first poly silicon layer 202 is in a range of approximately 100 Å~400 Å, such as 100 Å, 200 Å, 300 Å, or 400 Å, etc. The thickness of the first poly silicon layer 202 and the thickness of a subsequently formed hard mask layer may define the thickness of subsequently formed floating gates.

In certain other embodiments, the thickness of the first poly silicon layer 202 is in a range of approximately 400 Å~1000 Å, such as 500 Å, 600 Å, 700 Å, 800 Å, or 900 Å, etc. The thickness of the first poly silicon layer 202 may directly define the thickness of the subsequently formed floating gates.

Various processes may be used to form the first poly silicon layer 202, such a chemical vapor deposition (CVD) process, a physical vapor deposition (PVD) process, or a flowable CVD (FCVD) process, etc. In one embodiment, the first poly silicon layer 202 is formed by a CVD process.

Referring to FIG. 3, before forming the first poly silicon layer 202, a protective oxide layer 201 may be formed on the surface of the semiconductor substrate 200. The protective oxide layer 201 may be used as a stop layer for subsequently etching the hard mask layer 203 and the first poly silicon layer 202. Further, the protective oxide layer 201 may be used as a protective layer when an ion implantation process is subsequently performed onto the bottom of subsequently formed second openings to form active regions. The protective oxide layer 201 may be formed by a CVD process, a PVD process, an ALD process, a thermal oxidation process, or an FCVD process, etc.

After forming the first poly silicon layer 202, the hard mask layer 203 may be formed on the surface of the first poly silicon layer 202. The hard mask layer 203 may be used as a mask layer for subsequently etching the first poly silicon layer 202.

The hard mask layer 203 may be made of a material different from that of the subsequently formed liner oxide layer such that the hard mask layer 203 and the subsequently formed liner oxide layer to have a significantly high etching selectivity. When the hard mask layer 203 is subsequently removed, the liner oxide layer may keep its completeness.

The hard mask layer 203 may be a simile layer structure or a multiple-stacked structure. When the hard mask layer 203 is a single layer structure, the hard mask layer 203 may be made of SiN, SiON, SiCN, SiC, TiN, TaN, SiCO, or BN, etc. When the hard mask layer 203 is a multiple-stacked structure, the bottom layer of the hard mask layer 203 may be made of a material different from the subsequently formed liner oxide layer. In one embodiment, the hard mask layer 203 is a double-layer structure. The double-layer structure may include a silicon nitride layer formed on the first poly silicon layer 202; and a silicon oxide layer formed on the silicon nitride layer. In one embodiment, the hard mask layer 203 is a single layer structure made of SiN.

Figure 4:
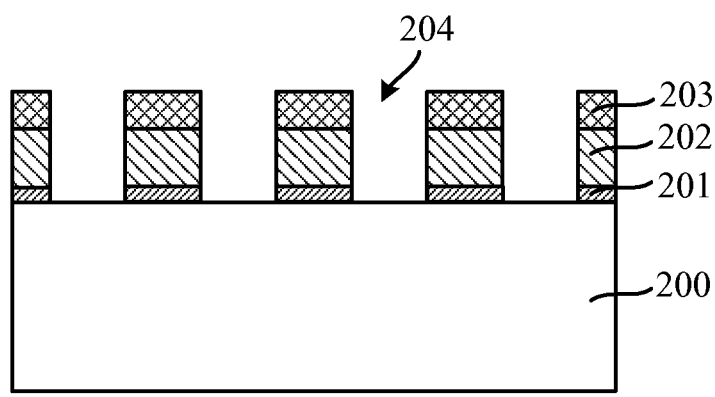

Returning to FIG. 12, after forming the hard mask layer 203, a plurality of first openings may be formed (S202). FIG. 4 illustrates a corresponding semiconductor structure.

As shown in FIG. 4, a plurality of first openings 204 are formed in the hard mask layer 203 and the first poly silicon layer 202. The first openings 204 may be formed by etching the hard mask layer 203 and the first poly silicon layer 202. The sidewall of the first openings 204 may expose a portion of the first poly silicon layer 202.

Before etching the hard mask layer 203 and the first poly silicon layer 202, a patterned photoresist layer (not shown) may be formed on the hard mask layer 203; and then the hard mask layer 203 and the first poly silicon layer 204 may be etched by using the patterned photoresist layer as an etching mask. In one embodiment, the protective oxide layer 201 formed on the surface of the semiconductor substrate 200 may also be etched when the first poly silicon layer 202 is etched.

Various processes may be used to etch the hard mask layer 203 and the first poly silicon layer 202, such as a dry etching process, a wet etching, process, or an ion beam etching process, etc. In one embodiment, the first hard mask layer 203 and the first poly silicon layer 202 are etched by a plasma etching process. The etching gas of the plasma etching process for etching the hard mask layer 203 may include one or more of $CF_4$, $CHF_3$, $C_4F_8$ and $C_4F_6$, etc. The etching gas of the plasma etching process for etching the poly silicon layer 202 may include one or more of $Cl_2$ and HBr, etc.

Figure 5:
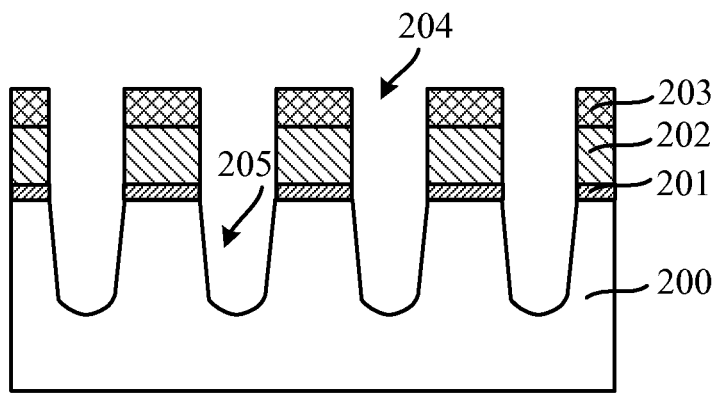

Returning to FIG. 12, after forming the first openings 204, a plurality of grooves may be formed in the semiconductor substrate 200 (S203). FIG. 5 illustrates a corresponding semiconductor structure.

As shown in FIG. 5, a plurality of grooves 205 are formed in the semiconductor substrate 200. The grooves 205 may be formed by etching the semiconductor substrate 200 along the first openings 204. The grooves 205 may be used to subsequently form shallow trench isolation structures. The semiconductor substrate 200 between adjacent trenches 205 may be configures as active regions. The subsequently formed shallow trench isolation structures in the trenches 205 may be configured to electrically isolate adjacent active regions.

Further, referring to FIG. 5, the bottom portion of the grooves 205 may be smaller than the top portion of the grooves 205. Such as a shape may aid to avoid forming voids in the subsequently formed floating gates because the material for forming the floating gate may not block the top portion of the grooves 205 when the floating gates are being subsequently formed.

Various processes may be used to etch the semiconductor substrate 200 to form the grooves 205, such as a dry etching process, a wet etching process, or an ion beam etching process, etc. In one embodiment, the grooves 205 are formed by a plasma etching process. The etching gas of the plasma etching process may include one or more of $Cl_2$, and HBr, etc.

Figure 6:
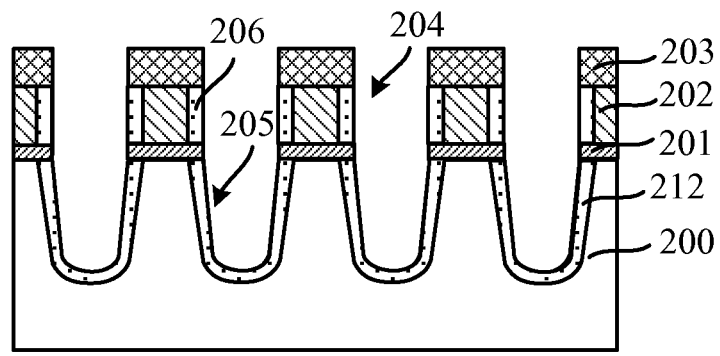

Returning to FIG. 12, after forming the grooves 205, liner oxide layers may be formed (S204). FIG. 6 illustrates a corresponding semiconductor structure.

As shown in FIG. 6, liner oxide layers 206 are formed on the side surface of the first poly silicon layer 202 exposed by the first openings 204. In one embodiment, the liner oxide layer 206 may be formed by oxidizing the sidewalls of the first poly silicon layer 202 exposed by the first openings 204, thus the liner oxide layer 206 is made of silicon oxide; and the liner oxide layer 206 may be referred as a liner silicon oxide layer 206.

The sidewalls of the first poly silicon layer 202 exposed by the first openings 204 may be oxidized by any appropriate process, such as a thermal oxidation process, a chemical oxidation process, or a plasma oxidation process, etc. In one embodiment, a thermal oxidation process is used to oxidize the sidewalls of the first poly silicon layer 202 to form the liner silicon oxide layer 206.

The flow of oxygen of the thermal oxidation process may be in a range of approximately 0.01 slm~50 slm. The temperature of the thermal oxidation process may be in a range of approximately 500° C.~1500° C. The pressure of the thermal oxidation process may be in a range of approximately 50 Torr~200 Torr. Such thermal oxidation parameters may cause the liner silicon oxide layer 206 and the non-oxidized first poly silicon layer 202 to have a desirable interface. The non-oxidized poly silicon layer 202 may be subsequently removed to form a plurality of second openings and the sidewall of the second openings may have a desirable morphology. Thus, the floating gates subsequently formed in the second openings may have desirable sidewall morphologies as well.

The thickness of the liner silicon oxide liner 206 may be in a range of approximately 1 Å~30 Å. If the thickness of the liner silicon oxide layer 206 is significantly large, the width of the subsequently formed floating gate is reduced; and the performance of the flash memory device may be affected. If the thickness of the liner silicon oxide layer 206 is substantially small, the compensation effect of the liner silicon oxide layer 206 to the subsequently formed tunnel, oxide layers may be substantially weak.

Referring to FIG. 6, in one embodiment, when the liner silicon oxide layer 206 is being formed, a pad oxide layer 212 may also be formed on the side surface and the bottom surface of the grooves 205. That is, the semiconductor substrate 200 exposed by the grooves 205 may react with the oxygen of the thermal oxidation process, and the pad oxide layer 212 may be formed.

In certain other embodiments, the liner silicon oxide layer 206 may be formed after forming the first openings 204 and before forming the grooves 205 by oxidizing the first poly silicon layer 202 exposed by the first openings 204, thus it may be able to control the thickness of the liner silicon oxide layer 206; and the thickness of the liner silicon oxide layer 206 may be greater than the thickness of the subsequently formed pad oxide layer 212. Such a controlling may cause the distance between the inner surfaces of two adjacent liner silicon oxide layers 206 to be smaller than the width of the active region, the width of the semiconductor substrate 200 between adjacent grooves 205. When floating gates are subsequently formed, the width of the first portion of the floating gate may be smaller than the width of the float gate oxide layer; the width of the first portion of the floating gate may be smaller than the width of the active region; and the width of the tunnel oxide layer may be greater, or equal to the width of the active region.

Figure 7:
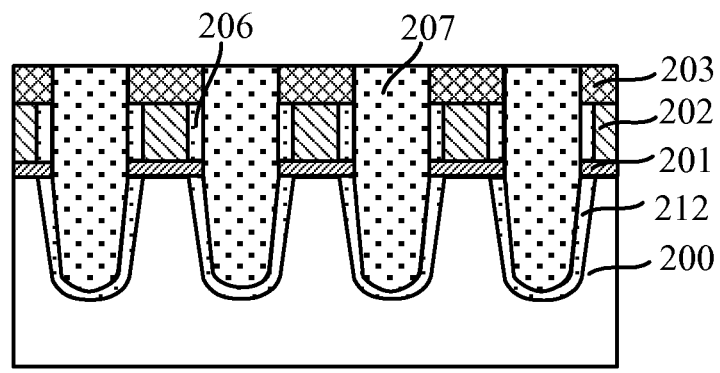

Returning to FIG. 12, after forming the liner silicon oxide layer 206, a plurality shallow trench isolation structures may be funned (S205). FIG. 7 illustrates a corresponding semi conductor structure.

As shown in FIG. 7, a shallow trench isolation structure 207 is formed in each of the first openings 204 and the grooves 205. The shallow trench isolation structure 207 may cover the liner silicon oxide layer 206.

The shallow trench isolation structures 207 may be formed by filling an isolation material in the first openings 204 and the grooves 205. The isolation material used for forming the shallow trench isolation structure 207 may be different from that of the hard mask layer 203 such that the hard mask layer 203 and the shallow trench isolation structure 207 may have a significantly high etching selectivity when the hard mask layer 203 is subsequently removed. In one embodiment, the shallow trench isolation structure 207 is made of silicon oxide. In certain other embodiments, the shallow trench isolation structure 207 may be made of any other appropriate material.

A process for forming the shallow trench isolation structures 207 may include sequentially forming an isolation film on the hard mask layer 203 and filling the first openings 204 and the grooves 205; and followed by planarizing the isolation film by a chemical mechanical polishing process using the hard mask layer 203 as a stop layer. Thus, the shallow trench isolation structures 207 may be formed in the first openings 204 and the trenches 205.

In certain other embodiments, when the hard mask layer 203 is a double-stacked layer having a silicon nitride layer and a silicon oxide layer, the silicon nitride layer may be used as the stop layer for the chemical mechanical polishing process. That is, the silicon oxide layer may be removed when the isolation material layer is planarized by the chemical mechanical polishing process.

Figure 8:
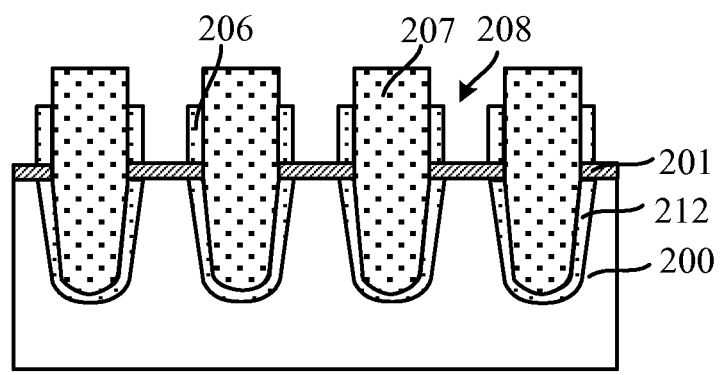

Returning to FIG. 12, after forming the shallow trench isolation structures 207, the hard mask layer 203 and the non-oxidized first poly silicon layer 202 may be removed (S206). FIG. 8 illustrates a corresponding semiconductor structure.

As shown in FIG. 8, the hard mask layer 203 and the none-oxidized first poly silicon layer 202 are removed, and a plurality of second openings 208 are formed. The second openings 208 may be used for subsequently forming tunnel oxide layers and floating gates.

Various processes may be used to remove the hard mask layer 203, such as a dry etching process, or a wet etching process, etc. In one embodiment, the hard mask layer 203 is removed by a wet etching process. The etching solution may be phosphoric acid.

The non-oxidized first poly silicon layer 202 may be removed by any appropriate process, such as a dry etching process, or a wet etching process, etc. In one embodiment, the non-oxidized first poly silicon layer 202 is removed by a wet etching process. The etching solutions may be a KOH solution, or a tetramethylammonium hydroxide (TMAH) solution, etc. The mass concentration of the KOH solution or the TMAH solution may be in a range of approximately 5%~15%.

After removing the hard mask layer 203 and the non-oxidized first poly silicon 202, the liner oxide layers 206 may be kept at both sides of the second openings 208. Thus, the second opening 208 may have two interoperating parts; the top part and the bottom part. The bottom part of the second opening 208 may refer to the portion of the second opening 208 between the two liner oxide layers 206. The top part of the second opening 208 may refer to the portion of the opening 208 above the liner oxide layers 206. Referring to FIG. 8, the width of the bottom part of the second opening 208 is smaller than the width of the top part of the second opening 208. A floating gate may be subsequently formed in the second opening 208, thus the floating gate may include a first portion and a second portion. The first portion of the floating gate may fill the bottom part of the second opening 208; and the second portion of the floating gate may fill the top part of the second opening 208. Therefore, the width of the first portion of the floating gate may be smaller than the width of the second portion of the floating gate.

After forming the second openings 208, an ion implantation process may be performed onto the semiconductor substrate at the bottom of the second openings 208 to form active regions (not shown). That is, the semiconductor substrate 200 at the bottom of the second openings 208 may be doped with a certain type of ions; and the active regions of the flash memory device may be formed.

Figure 9:
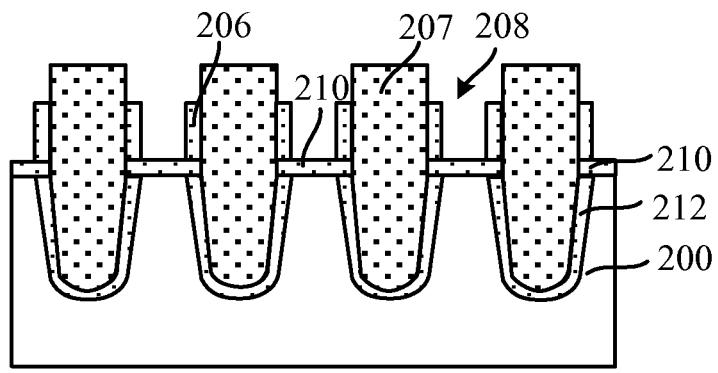

Returning to FIG. 12, after forming the active regions, a tunnel oxide layer may be formed in each of the second openings 208 (S207). FIG. 9 illustrates a corresponding semiconductor structure.

As shown in FIG. 9, a tunnel oxide layer 210 is formed on the semiconductor substrate 200 at the bottom of each of the second openings 208. Before forming the tunnel oxide layer 210, the protective oxide layer 201 may be removed.

The tunnel oxide layer 210 may be made of any appropriate oxide. In one embodiment, the tunnel oxide layer 210 is made of silicon oxide. Thus, the tunnel oxide layer 210 may be referred as a floating gate silicon oxide layer 210. The floating gate silicon oxide layer 210 may be formed by any appropriate process, such as a thermal oxidation process, or a chemical oxidation process, etc. In one embodiment, the floating gate silicon oxide layer 210 is formed by a thermal oxidation process. That is, the floating gate silicon oxide layer 210 may be formed by oxidizing the surface of the semiconductor substrate 200 exposed by the second openings 208 after removing the protective oxide layer 201 The thermal oxidation process may include a furnace oxidation process, or a plasma oxidation process, etc.

In one embodiment, the protective oxide layer 201 may be removed directly by a wet etching process or a dry etching process. Because the protective oxide layer 201 may be relatively thin, the process for directly removing the protective oxide layer 201 may generate to significantly small damage onto the liner oxide layers 206 and the shallow trench isolation structures 207.

In certain other embodiments, before removing the protective oxide layer 201, a photoresist layer (not shown) may be formed on the shallow trench isolation structures 207 and the liner oxide layers 206. The photoresist layer may have an opening exposing the protective oxide layer 201. Then, a wet etching process or a dry etching process may be used to remove the protective oxide layer 201.

The etching solution of the wet etching process may be a diluted hydrogen fluoride solution, etc. The etching gas for the dry etching process may be $CF_4$, $CHF_3$ or $C_4F_8$, etc.

When the floating gate silicon oxide layer 210 is being formed, the liner oxide layer 206 may compensate the floating gate silicon oxide layer 210 along the surface of the semiconductor substrate 200, the floating gate silicon oxide layer 210 and the liner oxide layer 206 may be formed together, thus the oxide loading effect may be avoided. That is, the issue that the thickness of the floating gate silicon oxide layer 210 at the edge region is smaller than the thickness of the floating gate silicon oxide layer 210 in the middle region may be prevented.

Further, referring to FIG. 9, the width of the floating gate silicon oxide layer 210 may be greater than the width of the bottom part of the second opening 208 because the liner oxide layers 206 may be formed on both side surfaces of the bottom part of the second opening 208. That is, the width of the bottom part of the second opening 208 may be equal to the width of the floating gate silicon oxide layer 210 subtracted by two times of the thickness of the liner oxide layer 206. Correspondingly, when the floating gate is subsequently formed in the second opening 208, the width of the floating gate silicon oxide layer 210 may be greater than the width of the first portion of the floating gate. Such a physical profile of the floating gate silicon oxide layer 210 and the floating gate may prevent the TDDB and leakage issues at the edge of the floating gate silicon oxide layer 210 when the flash memory device is working.

Returning to FIG. 12, after forming the floating gate silicon oxide layers 210, a plurality of floating gates may be formed on the floating gate silicon oxide layers 210 (S208). FIGS. 10~11 illustrate corresponding semiconductor structures.

As shown in FIG. 10, a floating gate material layer 209 is formed to cover the shallow trench isolation structures 207, the liner oxide layers 206 and the semiconductor substrate 200. The floating gate material layer 209 may fill the second openings 208. The floating gate material layer 209 may be made of any appropriate material used as a floating gate of the flash memory device. In one embodiment, the floating gate material layer 209 is made of poly silicon, thus the floating gate material layer 209 may also be referred as a second poly silicon layer 209.

Various processes may be used to form the floating gate material layer 209, such as a CVD process, a PVD process, or an FCVD process, etc. In one embodiment, a CVD process is used to form the floating gate material layer 209. Because the width of the top portion of the second opening 208 may be greater than the width of the bottom portion of the second opening 208, and the width the top portion of the groove 205 may also be greater than the bottom portion of the groove 205, when the floating gate material is filled into the second opening 208 and the groove 205, the floating gate material may not block the opening of the second opening 208, voids may be prevented from forming in the subsequently formed floating gates. The thickness of the floating gate material layer 209 may be in a range of approximately 400 Å~1000 Å.

Further, as shown in FIG. 11, after forming the floating gate material layer 209, a chemical mechanical polishing process may be performed to planarize the floating material layer 209 using the shallow trench isolation structure 207 as a stop layer. Thus, the floating gates 211 may be formed on the surface of the floating gate silicon oxide layers 210.

The floating gate 211 may include two portions: a first portion (not labeled) and a second portion (not labeled) formed on the first portion. The first portion may fill the bottom part of the second opening 208 and contact with the floating gate silicon oxide layer 210. The second portion may fill the top pan of the second opening 208. Thus, the width of the first portion of the floating gate 211 may be smaller than the width of the second portion of the floating gate 211. Further, the width of the first part of the floating gate 211 may be smaller than the width of the floating gate silicon oxide layer 210, the floating gate silicon oxide layer 210 and the liner oxide layer 206 together may better electrically isolate the floating gate 211 from the semiconductor substrate 200, thus the electrons stored in the floating gate 211 may be prevented from leaking into the semiconductor substrate 200. Therefore, the data retention performance of the flash memory device may be improved.

In certain other embodiments, the floating gates may be formed by forming the floating gate material layer 210 to cover the shallow trenches isolation structures 207, the liner oxide layers 206 and the surface of the of semiconductor substrate 200; and followed by planarizing the floating gate material layer by a chemical mechanical polishing process until the liner oxide layer 206 is exposed. Thus, a plurality of floating, gates may be formed.

Thus, a flash memory device may be formed by the above disclosed processes and methods; and a corresponding flash memory structure is illustrated in FIG. 11. As shown in FIG. 11, the flash memory device includes a semiconductor substrate 200 and a plurality of grooves (not labeled) formed in one surface of the semiconductor substrate 200. The flash memory device also includes a plurality of active regions (not labeled) between adjacent grooves; and a floating gate silicon oxide layer 210 formed on each of the active regions. Further, the flash memory device includes a floating gate 211 having a first portion with a width smaller than the width of the floating gate silicon oxide layer 210 and a second portion with a width greater than the width of the first portion formed on the first portion formed on each of the floating gate silicon oxide layers 210. Further, the flash memory device also includes a shallow trench isolation structure 207 formed in each of the grooves and between adjacent floating gates 211; and liner layers 206 formed on the floating gate silicon oxide layer 210 at both sides of the shallow trench isolation structures 207. The detailed structures and intermediate structures are described above with respect to the fabrication processes.

Therefore, according to the disclosed methods and device structures, liner oxide layers may be formed by oxidizing the poly silicon layer, the loading effect may be reduced, and the quality and uniformity of the tunnel oxide layer may be improved. Further, a significantly thick tunnel oxide layer may be formed with the assistance of the liner oxide layers. Further, the bottom width of the floating gate may be smaller than the width of the floating gate silicon oxide layer. Such a quality and a physical profile of the floating gate and floating gate silicon oxide layer may prevent the TDDB and the current leakage issues of the flash memory devices; and the data retention performance of the floating gate may be improved. Further, the profile of the grooves formed in the semiconductor substrate may aid to avoid the formation of voids in the floating gate, thus the performance of the flash memory device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a flash memory device, comprising:
providing a semiconductor substrate;
forming a first polysilicon layer on a surface of the semiconductor substrate;
forming a hard mask layer on the first polysilicon layer;
forming a plurality of first openings to expose the first polysilicon layer in the hard mask layer and first polysilicon silicon layer by etching the hard mask layer and the first polysilicon, forming a plurality of grooves in the semiconductor substrate by etching the semiconductor substrate along the first openings;
forming liner oxide layers by oxidizing the first polysilicon layer exposed by the first openings;

forming shallow trench isolation structures covering the liner oxide layers by filling the first openings and the grooves with an isolation material;

forming second openings by removing the hard mask layer and a non-oxidized first polysilicon layer;

forming a tunnel oxide layer on the surface of the semiconductor substrate at a bottom of each of the second openings; and forming a floating gate on each of the tunnel oxide layers.

2. The method according to claim 1, wherein:
the liner oxide layers are made of silicon oxide.

3. The method according to claim 1, wherein:
the liner oxide layers are formed by a thermal oxidation process.

4. The method according to claim 3, wherein:
a gas of the thermal oxidation process is oxygen;
a flow of oxygen is in a range of approximately 0.01 slm~50 slm;
a temperature of the thermal oxidation process is in a range of approximately 500° C.~1500° C.; and
a pressure of the thermal oxidation process is in a range of approximately 50 Torr~200 Torr.

5. The method according to claim 4, wherein forming the liner oxide layer further includes:
forming a pad oxide layer on side and bottom surfaces of the grooves simultaneously.

6. The method according to claim 2, wherein:
a thickness of the liner oxide layers is in a range of approximately 1 Å~30 Å.

7. The method according to claim 1, wherein:
a thickness of the first polysilicon layer is in a range of approximately 400 Å~1000 Å.

8. The method according to claim 1, wherein forming a floating gate on each of the tunnel oxide layers further includes:
forming a floating gate material layer to cover the shallow trench isolation structures, the liner oxide layers, the tunnel oxide layers and the surface of the semiconductor substrate and to fill the second openings; and
planarizing the floating gate material layer and the shallow trench isolation structures as long as a final thickness of the floating gate is higher than the liner oxide layer.

9. The method according to claim 1, wherein:
the second opening includes a bottom part and a top part interpenetrating the bottom part;
the bottom part is in between two liner oxide layers;
the top part is over the two liner oxide layers; and
a width of the bottom part is smaller than a width of the top part.

10. The method according to claim 1, wherein:
the floating gate includes a first portion and a second portion formed on the first portion;
the first portion fills the bottom part of the second opening;
the second portion fills the top part of the second opening; and
a width of the first portion is smaller than a width of the second portion.

11. The method according to claim 1, wherein thrilling a floating gate on each of the tunnel oxide layers further includes:
forming a floating gate material layer to cover the shallow trench isolation structures, the liner oxide layers, the tunnel oxide layers and the surface of the semiconductor substrate to fill the second openings; and
planarizing the floating gate material layer and the isolating structures using the shallow trench isolation structures as a stop layer.

12. The method according to claim 1, wherein:
the hard mask layer is a single layer structure.

13. The method according to claim 1, wherein:
the hard mask layer is a multiple-stacked structure.

14. The method according to claim 13, wherein:
the hard mask layer is a double-layer structure having a silicon nitride layer formed on the first polysilicon layer and a silicon oxide layer formed on the silicon nitride layer.

15. The method according to claim 2, wherein:
the hard mask layer and the non-oxidized first polysilicon layer are removed by a wet etching process using a KOH solution or a tetramethylammonium hydroxide (TMAH) solution.

* * * * *